United States Patent
Ning et al.

(10) Patent No.: US 11,114,635 B2
(45) Date of Patent: Sep. 7, 2021

(54) METHOD FOR MAKING POLYMER SOLAR CELL

(71) Applicants: Tsinghua University, Beijing (CN); HON HAI PRECISION INDUSTRY CO., LTD., New Taipei (TW)

(72) Inventors: Wen Ning, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 46 days.

(21) Appl. No.: 16/155,894

(22) Filed: Oct. 10, 2018

(65) Prior Publication Data
US 2019/0319204 A1    Oct. 17, 2019

(30) Foreign Application Priority Data
Apr. 16, 2018 (CN) .......................... 201810337787.9

(51) Int. Cl.
*H01L 51/42* (2006.01)
*H01L 51/44* (2006.01)
*H01L 51/00* (2006.01)

(52) U.S. Cl.
CPC ...... *H01L 51/4273* (2013.01); *H01L 51/0003* (2013.01); *H01L 51/0034* (2013.01); *H01L 51/0048* (2013.01); *H01L 51/441* (2013.01)

(58) Field of Classification Search
CPC .................... H01L 2031/0344; H01L 51/4266
See application file for complete search history.

(56) References Cited

U.S. PATENT DOCUMENTS

| | | | | |
|---|---|---|---|---|
| 6,451,415 B1* | 9/2002 | Forrest | ............... | B82Y 10/00 428/212 |
| 2005/0269564 A1* | 12/2005 | Narayan | ............ | B82Y 10/00 257/40 |
| 2006/0249203 A1* | 11/2006 | Li | ..................... | B82Y 10/00 136/263 |
| 2008/0319207 A1* | 12/2008 | Laird | ............... | H01L 51/4253 549/29 |

(Continued)

FOREIGN PATENT DOCUMENTS

| CN | 102646745 | 8/2012 |
|---|---|---|
| TW | 201624738 | 7/2016 |

*Primary Examiner* — Alex A Rolland
(74) *Attorney, Agent, or Firm* — ScienBiziP, P.C.

(57) ABSTRACT

A method for making a polymer solar cell includes placing a carbon nanotube array into a polymer solution. The carbon nanotube array includes a plurality of carbon nanotubes. Each carbon nanotube includes a first end and a second end opposite to the first end. The polymer solution is cured to form a polymer layer including a first polymer surface and a second polymer surface opposite to the first polymer surface. The first end is exposed from the polymer layer, and the second end is embedded in the polymer layer. An insulating layer is formed on the first polymer surface. A cathode electrode is formed on a surface of the insulating layer away from the polymer layer, and the first end passes through the insulating layer and is in direct contact with the cathode electrode. An anode electrode is formed on the second polymer surface.

19 Claims, 11 Drawing Sheets

(56) References Cited

U.S. PATENT DOCUMENTS

| | | | |
|---|---|---|---|
| 2011/0220191 A1* | 9/2011 | Flood | B82Y 30/00 |
| | | | 136/255 |
| 2015/0243820 A1* | 8/2015 | Liu | H01L 35/08 |
| | | | 136/206 |
| 2017/0365418 A1 | 12/2017 | Schumann et al. | |

* cited by examiner

METHOD FOR MAKING POLYMER SOLAR CELL

CROSS-REFERENCE TO RELATED APPLICATIONS

This application is related to commonly-assigned applications entitled, "POLYMER SOLAR CELL", concurrently filed Ser. No. 16/155,900; "POLYMER SOLAR CELL", concurrently filed Ser. No. 16/155,896; "METHOD FOR MAKING POLYMER SOLAR CELL", concurrently filed Ser. No. 16/155,897; "POLYMER SOLAR CELL", concurrently filed Ser. No. 16/155,898; "METHOD FOR MAKING POLYMER SOLAR CELL", concurrently filed Ser. No. 16/155,899. Ser. Nos. 16/155,900 and 16/155,894 share the same specification, Ser. Nos. 16/155,896 and 16,155,897 share the same specification, and Ser. Nos. 16/155,898 and 16/155,899 share the same specification. Disclosures of the above-identified applications are incorporated herein by reference.

FIELD

The present application relates to polymer solar cells and methods for making the same.

BACKGROUND

The polymer solar cell has many advantages such as wide raw materials and low cost, and has become one of the research hotspots in recent years. When the light reaches the photoactive layer of the polymer solar cell, the photoactive layer absorbs photons of the light and generates excitons. The excitons diffuse and reach the interface between the donor and the acceptor to form electrons and holes. The electrons pass through the acceptor and reach the cathode electrode, and the holes pass through the donor and reach the anode electrode. Thus, a potential difference between the cathode electrode and the anode electrode is formed. The use of solar light is an important factor to affect the photoelectric conversion efficiency of the polymer solar cell. A common method is to increase the solar light absorption rate by changing the material of the photoactive layer.

Al-Haik et la. (US20070110977A1) discloses that a plurality of carbon nanotubes are dispersed in a polymer and then these carbon nanotubes are oriented using a magnetic field, to form a composite. The composite can be acted as a photoactive material of the polymer solar cell. However, the carbon nanotubes are covered with the polymer, and the carbon nanotubes do not directly contact with the electrodes, thereby reducing the electrical conductivity between the carbon nanotubes and the electrodes.

Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

Figure 1:
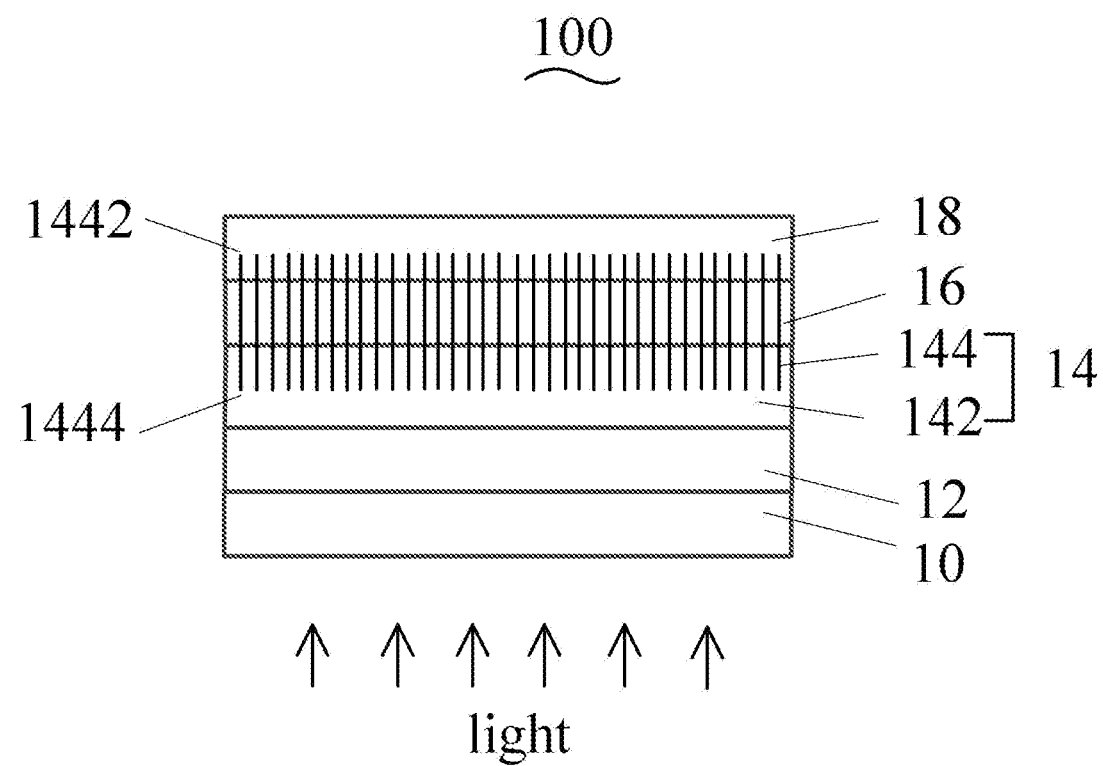
FIG. 1 schematically shows a first embodiment of a polymer solar cell.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Depending on the embodiment, certain of the steps or blocks described may be removed, others may be added, and the sequence of steps or blocks may be altered. It is also to be understood that the description and the claims drawn to a method may include some reference numeral indication referring to certain blocks or steps. However, the reference numeral indication used is only for identification purposes and not interpreted as a suggestion as to an order for the steps.

FIG. 1 shows a polymer solar cell 100 of a first embodiment and that includes a support 10, an anode electrode 12, a photoactive layer 14, an insulating layer 16, and a cathode electrode 18. The support 10, the anode electrode 12, the photoactive layer 14, the insulating layer 16, and the cathode electrode 18 are stacked on each other in that order. The photoactive layer 14 includes a polymer layer 142 and a plurality of carbon nanotubes 144 dispersed in the polymer layer 142. Furthermore, the support 10 can be omitted, because the photoactive layer 14 is a free-standing structure.

The support 10 can be transparent or opaque. The material of the support 10 can be glass, quartz, transparent plastic or resin. The material of the support 10 can be silicon. The anode electrode 12 and the cathode electrode 18 can be a transparent conductive layer or a porous mesh structure, such as ITO (indium tin oxide) layer, FTO (F-doped tin oxide) layer, or the like. The anode electrode 12 and the cathode electrode 18 can be opaque, such as aluminum layer, silver layer, or the like. When both the insulating layer 16 and the cathode electrode 18 are transparent, the support 10 and the anode electrode 12 can be transparent or opaque. When both the insulating layer 16 and the cathode electrode 18 are opaque, the support 10 and the anode electrode 12 are transparent. In one embodiment, light is irradiated to the photoactive layer 14 through the support 10 and the anode electrode 12, the support 10 is a glass plate, the material of the anode electrode 12 is ITO, and the material of the cathode electrode 18 is aluminum.

The polymer layer 142 functions as an electron donor. The material of the polymer layer 142 can be polythiophene and its derivative, polyfluorene and its derivative, poly-phenylene vinylene and its derivative, polypyrrole and its derivative, or any combination thereof. The polythiophene derivative can be poly(3-hexylthiophene) ($P_3HT$). The polyfluorene derivative can be poly(dioctylfluorene). The poly-phenylene vinylene derivative can be poly[2-methoxy-5-(2-ethyl-hexyloxy)-1,4-phenylene vinylene]. In one embodiment, the material of the polymer layer 142 is polythiophene.

The plurality of carbon nanotubes 144 functions as electron acceptors. The plurality of carbon nanotubes 144 are substantially parallel to each other. The plurality of carbon nanotubes 144 are spaced apart from each other. The plurality of carbon nanotubes 144 substantially extend along the same direction. The plurality of carbon nanotubes 144 extend from the polymer layer 142 to the cathode electrode 18, and pass through the insulating layer 16. Each carbon nanotube 144 has a first end 1442 and a second end 1444 opposite to the first end 1442. The first end 1442 is embedded in the cathode electrode 18. The second end 1444 is embedded in the polymer layer 142, such that the second end 1444 and the anode electrode 12 are spaced apart from each other. Thus, electrical insulation is between the anode electrode 12 and the carbon nanotubes 144 as electron acceptors. Thus, electrons do not migrate from the carbon nanotubes 144 to the anode electrode 12. It is ensure that all of the electrons migrate from the carbon nanotubes 144 to the cathode electrode 18.

Each carbon nanotube 144 consists of a first part, a second part, and a third part. The first part is embedded in the polymer layer 142, the second part is embedded in the insulating layer 16, and the third part is embedded in the cathode electrode 18. The carbon nanotubes 144 can be single-walled, double-walled, multi-walled carbon nanotubes, or their combinations. The single-walled carbon nanotubes 144 have a diameter of about 0.5 nanometers (nm) to about 50 nm. The double-walled carbon nanotubes 144 have a diameter of about 1.0 nm to about 50 nm. The multi-walled carbon nanotubes 144 have a diameter of about 1.5 nm to about 50 nm. The lengths of the carbon nanotubes 144 are substantially equal. In one embodiment, the structure formed by the carbon nanotubes 144 is a carbon nanotube array 20.

The function of the insulating layer 16 is to electrically insulate the polymer layer 142 from the cathode electrode 18, thereby preventing holes generated by the exciton separation from migrating from the polymer layer 142 to the cathode electrode 18. Thus, all of the holes can migrate from the polymer layer 142 to the anode electrode 12. The insulating layer 16 can be transparent or opaque. When the surface of the cathode electrode 18 away from the insulating layer 16 is the incident surface of light, the insulating layer 16 needs to be transparent. When the surface of the support 10 away from the anode electrode 12 is the incident surface of light, the insulating layer 16 can be transparent or opaque. The material of the transparent insulating layer 16 is not limited, such as poly ethyl methacrylate (PMMA), polycarbonate (PC), polyperfluoroethylene propylene (FEP), or polyvinyl fluoride (PVF). The material of the opaque insulating layer 16 is not limited, such as silica gel. The main component of the silica gel is silica. In one embodiment, the material of the insulating layer 16 is PMMA.

Figure 2:
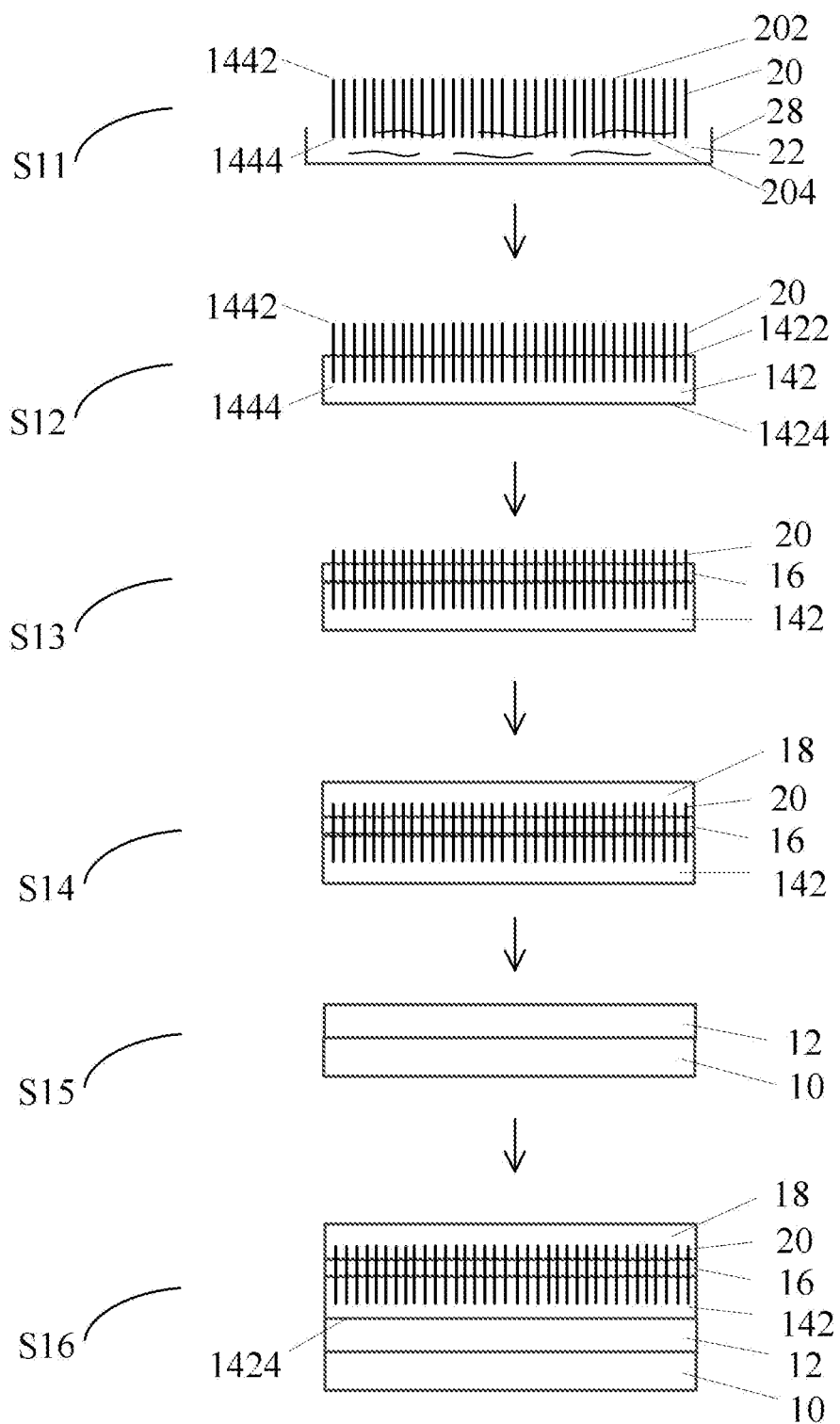
FIG. 2 is a process flow of a method for making the polymer solar cell of FIG. 1.

FIG. 2 shows the first embodiment of a method for making the polymer solar cell 100, and the method includes the following steps:

S11, placing the carbon nanotube array 20 into a polymer solution 22, wherein the carbon nanotube array 20 includes the plurality of carbon nanotubes 144, each of the plurality of carbon nanotube 144 has the first end 1442 and the second end 1444 opposite to the first end 1442, the first end 1442 is exposed out of the polymer solution 22, and the second end 1444 is immersed in the polymer solution 22 and coated with the polymer solution 22;

S12, curing the polymer solution 22 to form the polymer layer 142, wherein polymer layer 142 includes a first polymer surface 1422 and a second polymer surface 1424 opposite to the first polymer surface 1422, the first end 1442 is exposed out of the polymer layer 142, and the second end 1444 is embedded in the polymer layer 142;

S13, forming the insulating layer 16 on the first polymer surface 1422, wherein the first end 1442 passes through the insulating layer 16 and exposed out of the insulating layer 16;

S14, forming the cathode electrode 18 on a surface of the insulating layer 16 away from the polymer layer 142, wherein the first end 1442 is embedded in the cathode electrode 18;

S15, forming the anode electrode 12 on the support 10; and

S16, locating the second polymer surface 1424 on a surface of the anode electrode 12 away from the support 10.

In the step S11, the carbon nanotube array 20 has a first surface 202 and a second surface 204 opposite to the first surface 202, and the plurality of carbon nanotubes 144 extend from the first surface 202 to the second surface 204. The plurality of carbon nanotubes 144 are substantially parallel to and spaced apart from each other. The first ends 1442 of all of the carbon nanotubes 144 form the first surface 202, and the second ends 1444 of all of the carbon nanotubes 144 form the second surface 204. The length directions of the carbon nanotubes 144 are substantially perpendicular to the first surface 202. In one embodiment, the length directions of the carbon nanotubes 144 are perpendicular to the first surface 202, and the carbon nanotubes 144 are parallel to each other. The lengths of the carbon nanotubes 144 are greater than or equal to 100 nanometers. In one embodiment, the lengths of the carbon nanotubes 144 are several hundred micrometers to several hundred millimeters. In one embodiment, the lengths of the carbon nanotubes 144 are greater than or equal to 100 micrometers and less than or equal to 100 millimeters, such as 100 micrometers, 500 micrometers, 1000 micrometers, or 5 millimeters.

The polymer solution 22 is formed by dispersing a polymer material in an organic solvent, monomer solution, and so on. The organic solvent is not limited as long as the polymer can be dissolved in the organic solvent. The method for placing the carbon nanotube array 20 into the polymer solution 22 is not limited. The present invention provides two methods, but the two methods do not limit the invention.

Figure 3:
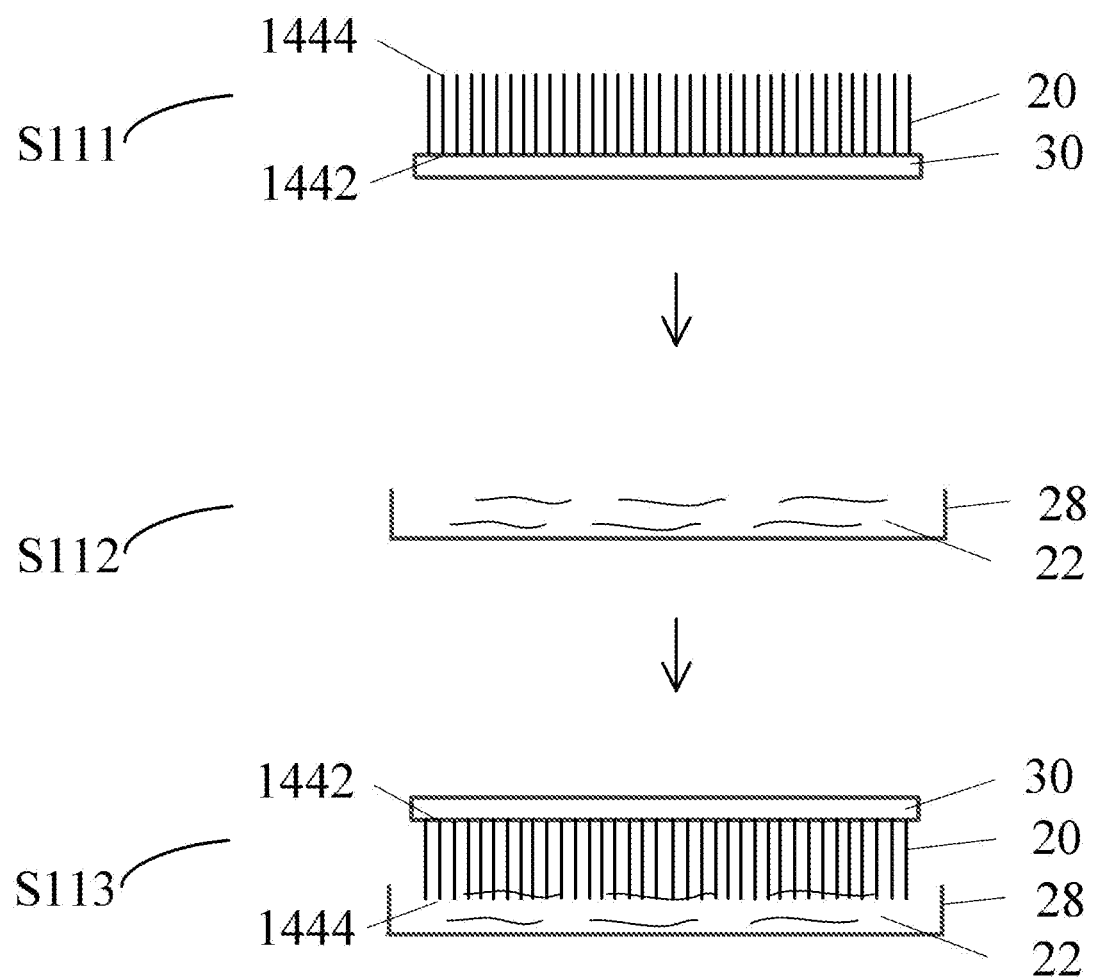
FIG. 3 is a process flow of the first embodiment of a method for placing a carbon nanotube array into a polymer solution.

FIG. 3 shows the first method for placing the carbon nanotube array 20 into the polymer solution 22, and the method includes the following steps:

S111, growing the carbon nanotube array 20 on a growth substrate 30, wherein the first end 1442 of each carbon nanotube 144 is in direct contact with the growth substrate 30, the second end 1444 of each carbon nanotube 144 is away from the growth substrate 30;

S112, placing the polymer solution 22 in a container 28; and

S113, inverting the growth substrate 30 to make a portion of each carbon nanotube 144 immersed in the polymer solution 22, wherein the second end 1444 is also immersed in the polymer solution 22.

In the step S111, the method for making the carbon nanotube array 20 includes the following steps: (a) providing a flat growth substrate 30, wherein the growth substrate 30 can be a P-type silicon wafer, an N-type silicon wafer or a silicon wafer formed with an oxidized layer thereon; and in one embodiment, a 4-inch, P-type silicon wafer is used as the growth substrate 30; (b) forming a catalyst layer on the growth substrate 30, wherein the catalyst layer is made of a material selected from the group consisting of iron (Fe), cobalt (Co), nickel (Ni), and an alloy thereof; (c) annealing the growth substrate 30 with the catalyst layer in air at a temperature in a range from 700° C. to 900° C. for about 30 minutes to about 90 minutes; (d) providing a carbon source gas at high temperature to a furnace for about 5 minutes to about 30 minutes to grow the carbon nanotube array 20 on the growth substrate 30.

In the step S113, the method for inverting the growth substrate 30 and partially immersing the carbon nanotube array 20 into the polymer solution 22 is not limited. For example, the growth substrate 30 can be fixed by a tool, such as tweezers, to invert the growth substrate 30.

It can be understood that, when the carbon nanotube array 20 is placed in the polymer solution 22 by the first method, it is necessary to further include a step of removing the growth substrate 30 before the step S13. The method for removing the growth substrate 30 is not limited, for example, the growth substrate 30 is peeled off using a tool, such as a knife, or the growth substrate 30 is etched using a laser.

Figure 4:
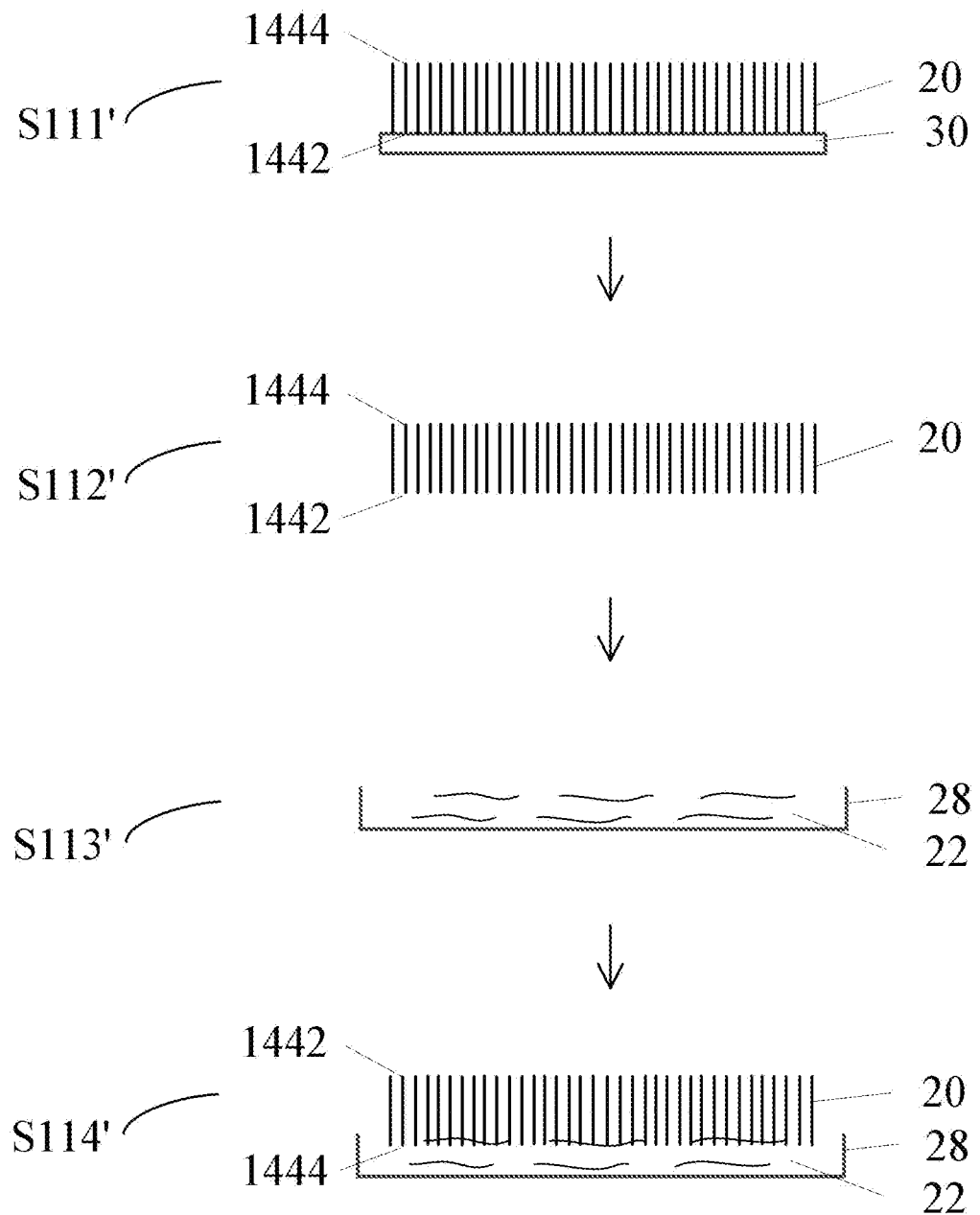
FIG. 4 is a process flow of the first embodiment of another method for placing the carbon nanotube array into the polymer solution.

FIG. 4 shows the second method for placing the carbon nanotube array 20 into the polymer solution 22 and the mthode includes the following steps:

S111', growing the carbon nanotube array 20 on a growth substrate 30, wherein the first end 1442 of each carbon nanotube 144 is in direct contact with the growth substrate 30, the second end 1444 of each carbon nanotube 144 is away from the growth substrate 30;

S112', removing the growth substrate 30;

S113', placing the polymer solution 22 in the container 28; and

S114', immersing a portion of each carbon nanotube 144 in the polymer solution 22.

In the step S112', the carbon nanotube array 20 can be totally peeled off from the growth substrate 30. In one embodiment, the carbon nanotube array 20 is totally peeled off from the growth substrate 30 by a knife or other similar tool along a direction parallel to the surface of the growth substrate 30. In the process of peeling off the carbon nanotube array 20, adjacent two of the carbon nanotubes 144 join together by van der Waals attractive force, therefore the carbon nanotube array 20 is free-standing structure. In one embodiment, two tweezers respectively clamp the two opposite sides of the carbon nanotube array 20.

The term "free-standing" includes, but not limited to, the carbon nanotube array 20 that does not have to be supported by a substrate. For example, a free-standing carbon nanotube array 20 can sustain itself when it is hoisted by a portion thereof without any significant damage to its structural integrity. So, if the free-standing carbon nanotube array 20 is placed between two separate substrates, a portion of the free-standing carbon nanotube array 20, not in contact with the two substrates, would be suspended between the two substrates and yet maintain structural integrity.

It can be understood that after curing the polymer solution 22 to form the polymer layer 142 in the step S12 and before combining the polymer layer 142 with the anode electrode 12 in the step S16, a step of removing the container 28 is needed. For example, the whole structure in the container 28 is taken out of the container 28. In addition, the method for curing the polymer solution 22 is not limited, for example, polymer solution 22 is heated to form the polymer layer 142.

In the step S13, the method for forming the insulating layer 16 is not limited. For example, the insulating layer 16 is first dissolved in a solvent to form a solution, and then the solution is sprayed or spin coated on the first polymer surface 1422 of the polymer layer 142. In one embodiment, PMMA is dissolved in the organic solvent to form a PMMA solution, and the PMMA solution is coated on the first polymer surface 1422. Then the PMMA solution penetrates into the gas between adjacent carbon nanotube 144. The height of the PMMA solution is less than the length of the carbon nanotube 144 exposed from the polymer layer 142. After curing, the PMMA solution forms a PMMA insulating layer, and the thickness of the PMMA insulating layer is less than the length of the carbon nanotube 144 exposed from the polymer layer 142. The first end 1442 of the carbon nanotube 144 passes through the PMMA insulating layer and is exposed out of the PMMA insulating layer.

In the step S14, the method for forming the cathode electrode 18 on the surface of the insulating layer 16 away from the polymer layer 142 is not limited, as sputtering, coating, vapor deposition, or spraying. A previously prepared cathode electrode 18, such as a metal piece, can be directly located on the surface of the insulating layer 16 away from the polymer layer 142. The cathode electrode 18 has a thickness such that the first end 1442 of the carbon nanotube 144 is embedded in the cathode electrode 18.

In the step S15, the method for forming the anode electrode 12 on the support 10 is not limited, such as sputtering, coating, vapor deposition, mask etching, spraying, or inkjet printing.

In the step S16, the method for locating the second polymer surface 1424 on the surface of the anode electrode 12 away from the support 10 is not limited. For example, the second polymer surface 1424 of the polymer layer 142 is adhered to the anode electrode 12. Alternatively, the product prepared in the step S14 and the product prepared in the step S15 can be combined to form an integrative structure by hot pressing or cold pressing.

In one embodiment, the hot pressing is used. The intermediate product prepared in the step S14 is stacked with the intermediate product prepared in the step S15 to form a stacked structure. The stacked structure is placed in a hot pressing device including a metal roll and a heating element. The metal roll is heated by the heating element, and the heating temperature can soften the anode electrode 12 and the polymer layer 142. And then the heated metal roll presses the stacked structure such that a pressure is applied on the stacked structure. During pressing the stacked structure by the heated metal roll, the anode electrode 12 and the polymer layer 142 can be softened and the air in the micropores of the stacked structure can be expelled. Thus, the anode electrode 12 and the polymer layer 142 can be closely pressed together. A rolling speed of the metal roll can be in a range from about 1 millimeter per minute to about 10 meters per minute. The pressure applied by the metal roll can be in a range from about 5 Pa to about 100 Pa. It can be understood that the temperature of the metal roll should be low enough so that the anode electrode 12, polymer layer 142, and other functional layers do not melt.

It can be understood that the anode electrode 12 can also be directly formed on the second polymer surface 1424 of the polymer layer 142 by sputtering, coating, evaporation, or the like. And then the support 10 is located on the anode electrode 12 away from the polymer layer 142. Furthermore, the anode electrode 12 is directly formed on the second polymer surface 1424 being free-standing structure, thus the support 10 that plays a supporting role can be omitted, and the step of disposing the support 10 can also be omitted.

It can be understood that the cathode electrode 18 is formed on the surface of the insulating layer 16 away from the polymer layer 142 to form a composite structure. Then, the support 10, the anode electrode 12, and the composite structure are sequentially stacked together. The anode electrode 12 is located between the support 10 and the second polymer surface 1424 of the polymer layer 142.

When any one of the anode electrode 12 and the cathode electrode 18 is a metal film, the metal film can reflect light that reaches the metal film into the photoactive layer 14, improving the utilization of light. Thus, the metal film plays an electric conducting and reflecting light role.

Figure 5:
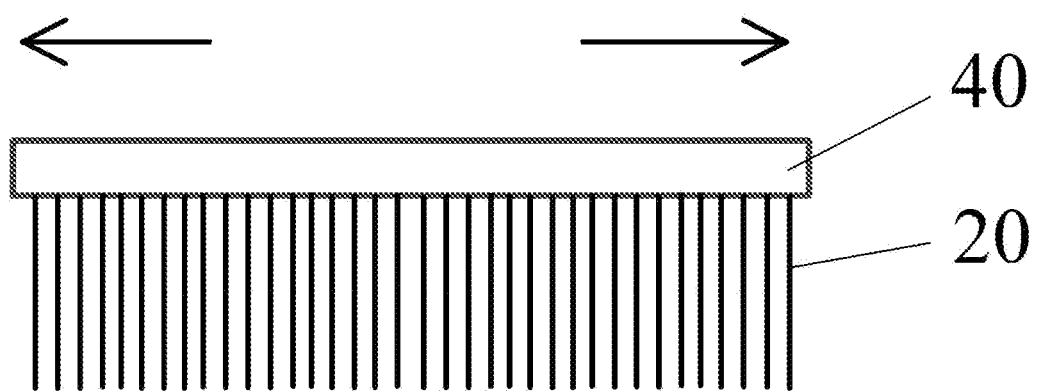
FIG. 5 schematically shows the first embodiment of pretreating the carbon nanotube array.

Furthermore, before curing the polymer solution 22, a step of pretreating the carbon nanotube array 20 can be included. FIG. 5 shows the method of pretreating the carbon nanotube array 20, and the method includes the following steps: (1) adhering the carbon nanotube array 20 to a surface of an elastic support 40, wherein the length direction of each carbon nanotube 144 is substantially perpendicular to the surface of the elastic support 40, and the carbon nanotube array 20 is adhered to the elastic support 40 by an adhesive in one embodiment; (2) respectively pulling the two opposite ends of the elastic support 40 along opposite directions. Under the pulling force, the elastic support 40 is stretched, the carbon nanotube array 20 is also stretched, and the distance between two adjacent carbon nanotubes 144 becomes longer. The pulling speed can be selected according to the carbon nanotube array 20. If the pulling speed is too large, the carbon nanotube array 20 would be easily broken. In one embodiment, the pulling speed is less than 2 cm/s. The advantage of pretreating the carbon nanotube array 20 is: after stretching the carbon nanotube array 20, the distance between two adjacent carbon nanotubes 144 becomes longer, thus the material of the insulating layer 16 is easy to enter the gap between two adjacent carbon nanotubes 144. The elastic support 40 has better elasticity, and the shape and structure of the elastic support 40 are not limited. The elastic support 40 can be a planar structure or a curved structure. The elastic support 40 can be an elastic rubber, a rubber band, or the like. The elastic support 40 is used to support and stretch the carbon nanotube array 20. It can be understood that after pretreating the carbon nanotube array 20, a step of removing the elastic support 40 is further included.

Figure 6:
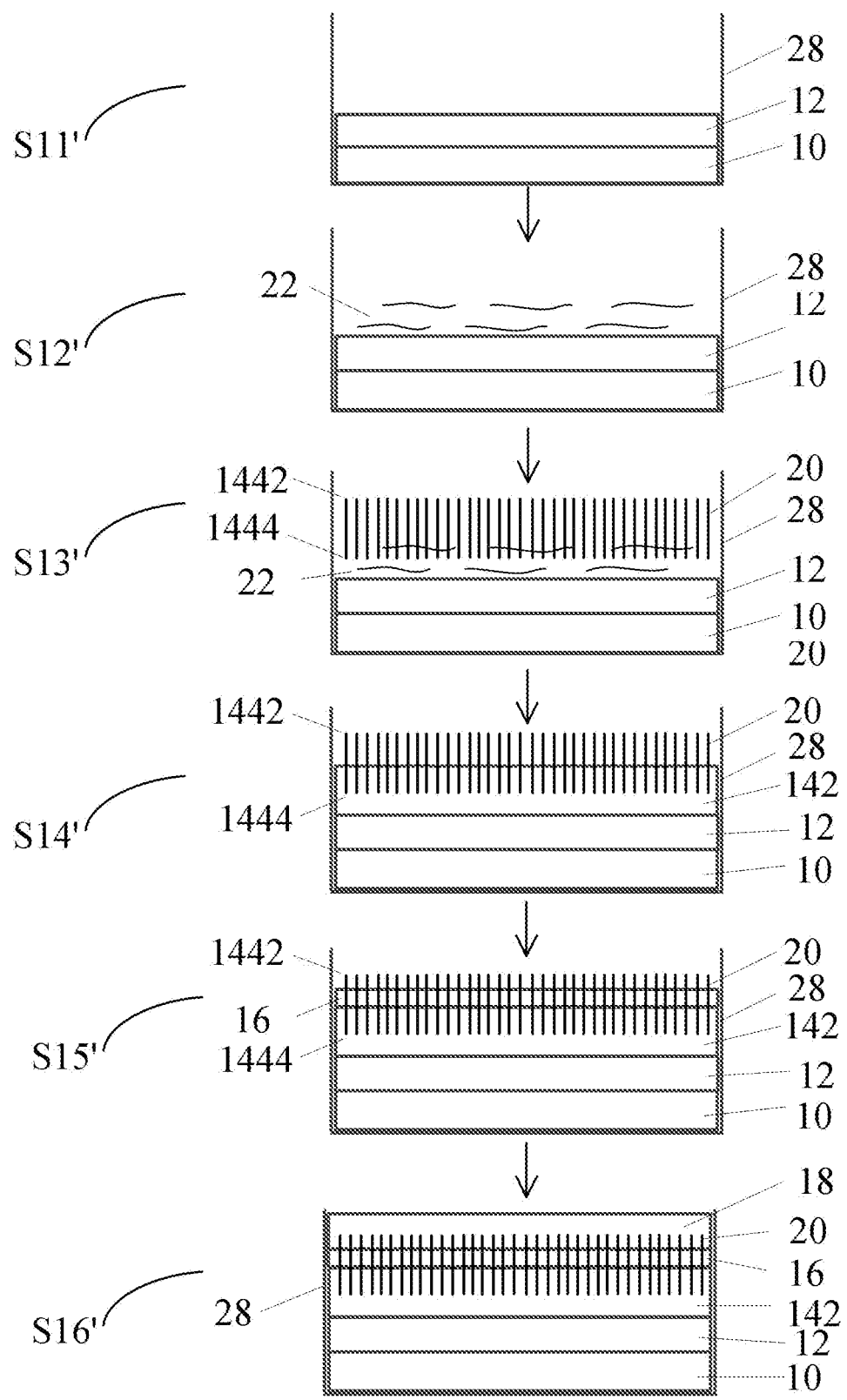
FIG. 6 is a process flow of another method for making the polymer solar cell of FIG. 1.

FIG. 6 shows the first embodiment of another method for making the polymer solar cell 100, and the method includes the following steps:

S11', placing the support 10 in a container 28, wherein the anode electrode 12 is formed on a surface of the support 10 away from the container 28;

S12', placing the polymer solution 22 in the container 28, wherein in one embodiment, the polymer solution 22 is located on a surface of the anode electrode 12 away from the support 10;

S13', locating the carbon nanotube array 20 in the polymer solution 22, wherein the carbon nanotube array 20 includes the plurality of carbon nanotubes 144, each of the plurality of carbon nanotube 144 has the first end 1442 and the second end 1444 opposite to the first end 1442, the first end 1442 is exposed out of the polymer solution 22, and the second end 1444 is immersed in the polymer layer 142 and coated with the polymer solution 22;

S14', curing the polymer solution 22 to form the polymer layer 142, wherein polymer layer 142 includes the first polymer surface 1422 and the second polymer surface 1424 opposite to the first polymer surface 1422, the first end 1442 is exposed out of the polymer layer 142, and the second end 1444 is embedded in the polymer layer 142; S15', forming the insulating layer 16 on the first polymer surface 1422, wherein the first end 1442 passes through the insulating layer 16 and exposed out of the insulating layer 16; and S16', forming the cathode electrode 18 on a surface of the insulating layer 16 away from the polymer layer 142, wherein the first end 1442 is embedded in the cathode electrode 18.

The method as shown in FIG. 6 is similar to the method as shown in FIG. 2 above except that the support 10 and the anode electrode 12 are located in the container 28, and then the polymer solution 22 is poured into the container 28; and finally the carbon nanotube array 20, the insulating layer 16, and the cathode electrode 18 are formed in that order.

In the step S12', the polymer solution 22 may flow between the support 10 and the sidewall of the container 28, and between the anode electrode 12 and the sidewall of the container 28 along the sidewall of the container 28. After curing the polymer solution 22, the polymer layer 142 can be also present between the support 10 and the sidewall of the container 28, and between the anode electrode 12 and the sidewall of the container 28. After removing the container 28, the polymer layer 142 is on the opposite sides of the support 10 and the anode electrode 12, thereby increasing the bonding force between the support 10, the anode electrode 12, and the polymer layer 142. Alternatively, the polymer layer 142 on the opposite sides of the support 10 and the anode electrode 12 can be removed by etching.

The support 10 in the step S11' can be omitted, and the anode electrode 12 is directly formed at the bottom of the container 28. The container 28 can be removed after forming the cathode electrode 18.

Figure 7:
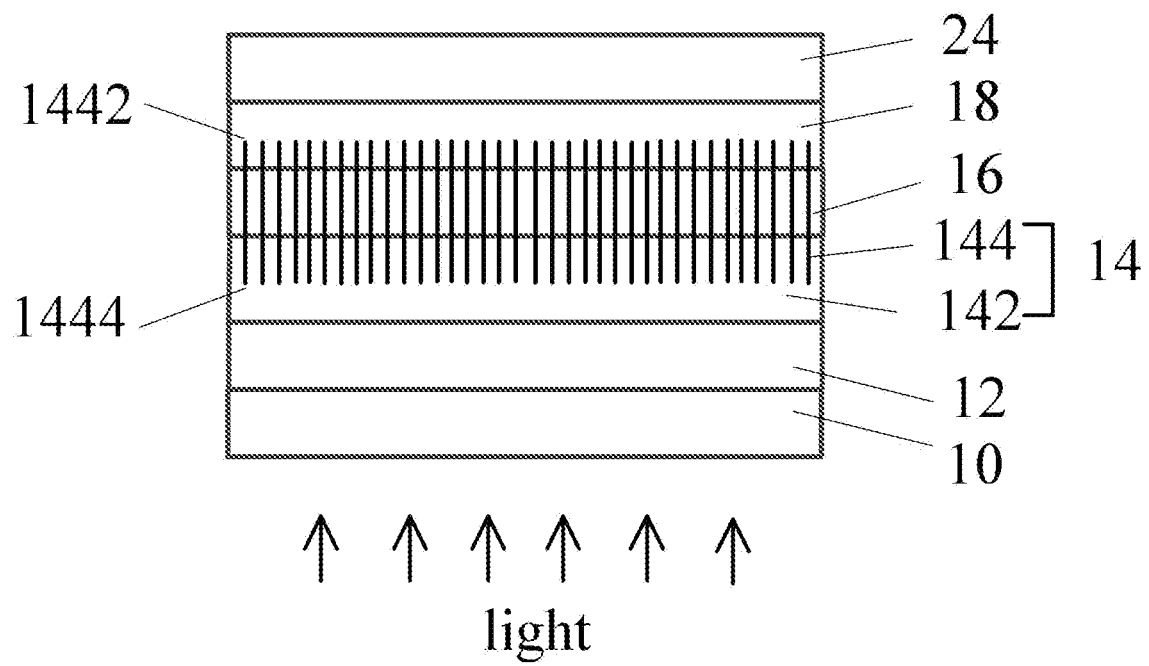
FIG. 7 schematically shows a second embodiment of a polymer solar cell.

FIG. 7 shows a polymer solar cell 200 of a second embodiment. The polymer solar cell 200 of the second embodiment is similar to the polymer solar cell 100 of the first embodiment above except that the polymer solar cell 200 further includes a reflective layer 24 located on the surface of the cathode electrode 18 away from the insulating layer 16. In the second embodiment, the support 10 is transparent, and the surface of the support 10 away from the anode electrode 12 is the incident surface of light. When the cathode electrode 18 is transparent and the surface of the cathode electrode 18 away from the insulating layer 16 is the incident surface of light, the reflective layer 24 is located on the surface of the support 10 away from the anode electrode 12.

The function of the reflective layer 24 is: when light reaches the photoactive layer 14 from the transparent support 10, part of the light that reaches the cathode electrode 18 can be reflected back into the photoactive layer 14 from the cathode electrode 18 by the reflective layer 24 located on the surface of the cathode electrode 18 away from the insulating layer 16. Thus, the utilization of light is improved. When light reaches the photoactive layer 14 from the cathode electrode 18, part of the light that reaches the support 10 can be reflected back into the photoactive layer 14 from the support 10 by the reflective layer 24 located on the surface of the support 10 away from the anode electrode. Thus, the utilization of light is improved. The material of the reflective layer 24 has a high reflectivity, and the material can be, but is not limited to, a metal or metal alloy. The metal can be gold, silver, aluminum, or calcium. The metal alloy can be an alloy of calcium and aluminum, an alloy of magnesium and silver, or the like.

In the second embodiment, the method for making the polymer solar cell 200 is provided. The method for making the polymer solar cell 200 in the second embodiment is similar to the method for making the polymer solar cell 100 in the first embodiment above except that the method for making the polymer solar cell 200 further includes a step of forming the reflective layer 24. When the support 10 is transparent, the reflective layer 24 is formed on the surface of the cathode electrode 18 away from the insulating layer 16 by sputtering, coating, vapor deposition, or the like. When the cathode electrode 18 is transparent, the reflective layer 24 is formed on the surface of the support 10 away from the anode electrode 12 by sputtering, coating, vapor deposition, or the like.

Figure 8:
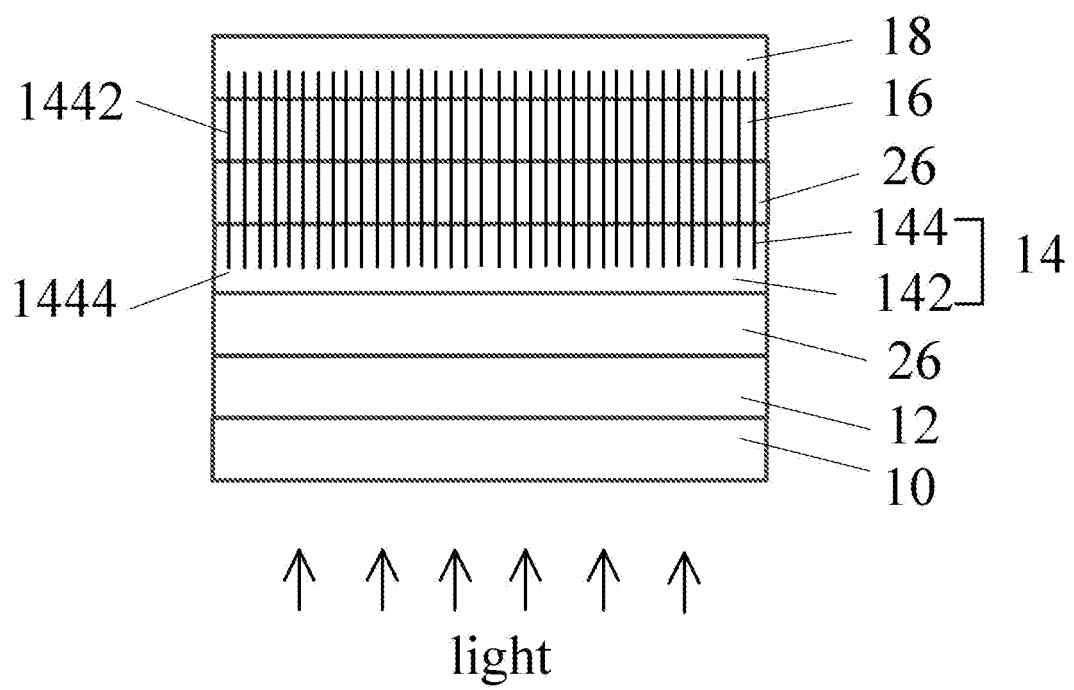
FIG. 8 schematically shows a third embodiment of a polymer solar cell.

FIG. 8 shows a polymer solar cell 300 of a third embodiment. The polymer solar cell 300 of the third embodiment is similar to the polymer solar cell 100 of the first embodiment above except that the polymer solar cell 300 further includes an exciton blocking layer 26. The exciton blocking layer 26 can be located between the photoactive layer 14 and the anode electrode 12. The exciton blocking layer 26 can also be located between the photoactive layer 14 and the insulating layer 16. When the exciton blocking layer 26 is located between the photoactive layer 14 and the insulating layer 16, the plurality of carbon nanotubes 144 pass through the exciton blocking layer 26 and the insulating layer 16, and are embedded into the cathode electrode 18.

The function of the exciton blocking layer 26 is: light reaches the photoactive layer 14 to form excitons, and the exciton blocking layer 26 prevents the excitons from diffusing toward the insulating layer 16 or the anode electrode 12, thereby making all excitons reach the interface between the donor and the acceptor. Thus, the utilization ratio of the excitons is improved, and accordingly the efficiency of photoelectric conversion of the polymer solar cell 300 is also improved. The material of the exciton blocking layer 26 is organic material, such as $Zn_4O(AID)_6$, $BAlQ_3$, BCP, Bphen, $Alq_3$, TAZ, or TPBI.

In the third embodiment, the method for making the polymer solar cell 300 is provided. The method for making the polymer solar cell 300 in the third embodiment is similar to the method for making the polymer solar cell 100 in the first embodiment above except that the method for making the polymer solar cell 300 further includes a step of forming the exciton blocking layer 26. After the step S12 and before the step S13, the exciton blocking layer 26 is formed on the first polymer surface 1422 of the polymer layer 142 by sputtering, coating, vapor deposition, or the like. Alternatively, before combining the second polymer surface 1424 with the surface of the anode electrode 12 away from the support 10, the exciton blocking layer 26 is formed on the second polymer surface 1424 by sputtering, coating, vapor deposition, or the like.

Figure 9:
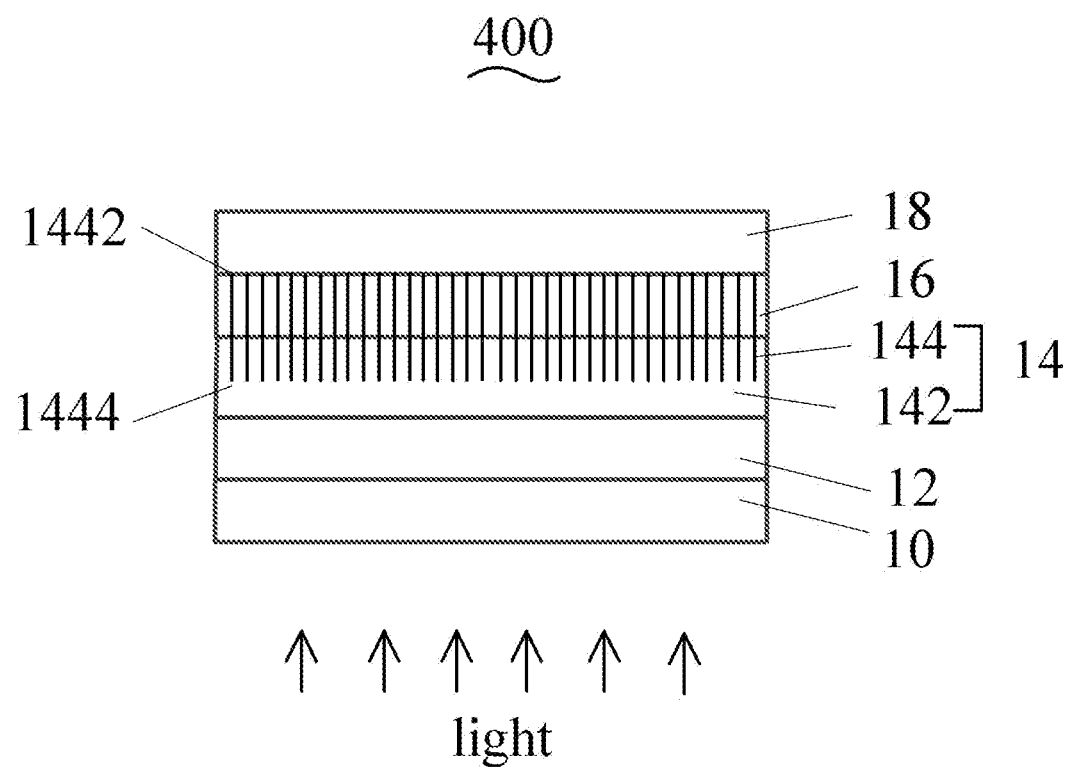
FIG. 9 schematically shows a fourth embodiment of a polymer solar cell.

FIG. 9 shows a polymer solar cell 400 of a fourth embodiment. The polymer solar cell 400 of the fourth embodiment is similar to the polymer solar cell 100 of the first embodiment above except that in the polymer solar cell 400, the first end 1442 of the carbon nanotube 144 is flush with the surface of the insulating layer 16 away from the polymer layer 142; and the first end 1442 of the carbon nanotube 144 is in direct contact with the surface of the cathode electrode 18, and is not embedded into the interior of the cathode electrode 18.

Figure 10:
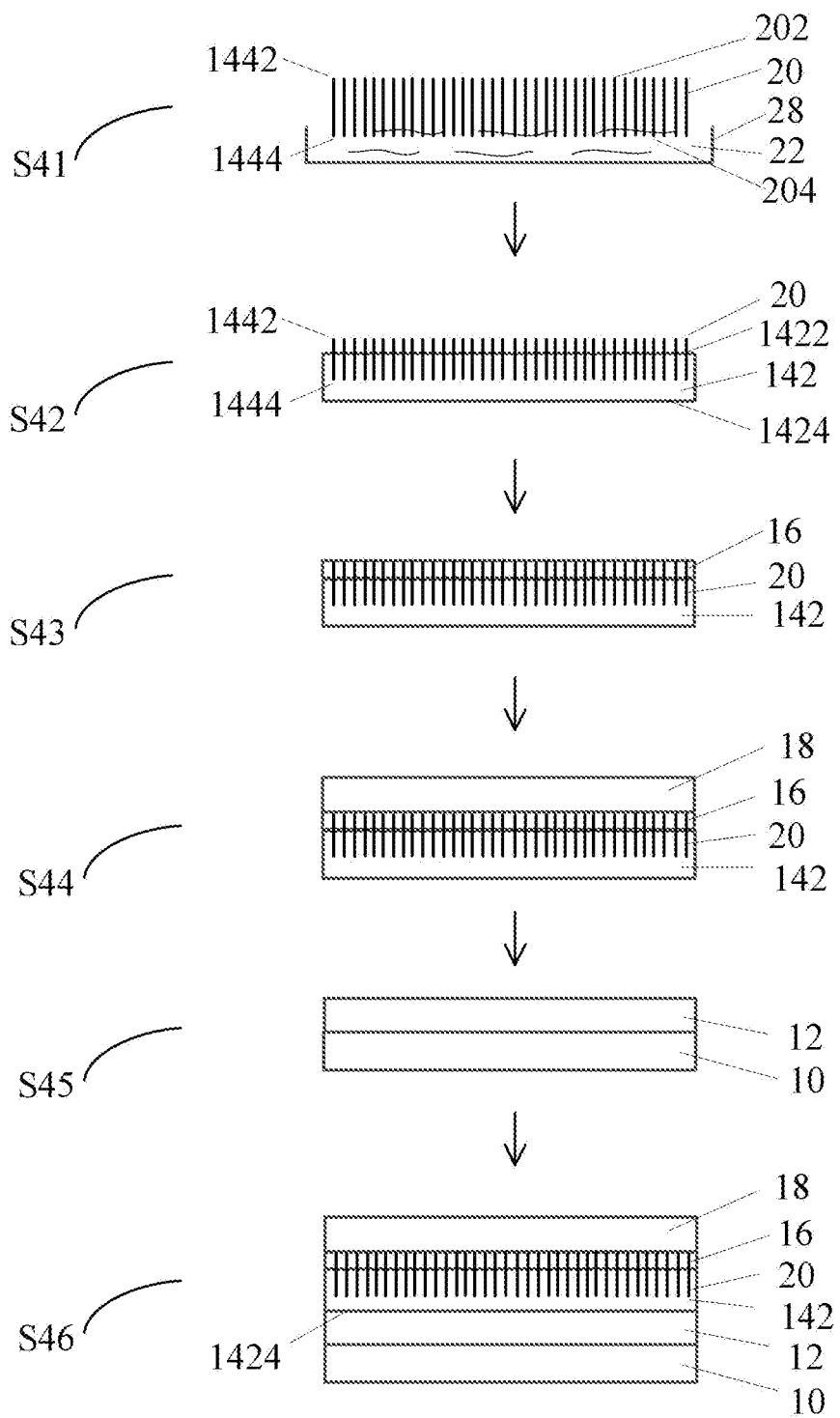
FIG. 10 is a process flow of a method for making the polymer solar cell of FIG. 9.

FIG. 10 shows the fourth embodiment of a method for making the polymer solar cell 400, and the method includes the following steps:

S41, locating the carbon nanotube array 20 in the polymer solution 22, wherein the carbon nanotube array 20 includes the plurality of carbon nanotubes 144, each of the plurality of carbon nanotube 144 has the first end 1442 and the second end 1444 opposite to the first end 1442, the first end 1442 is exposed out of the polymer solution 22, and the second end 1444 is immersed in the polymer solution 22 and coated with the polymer solution 22;

S42, curing the polymer solution 22 to form the polymer layer 142, wherein polymer layer 142 includes the first polymer surface 1422 and the second polymer surface 1424 opposite to the first polymer surface 1422, the first end 1442 is exposed out of the polymer layer 142, and the second end 1444 is embedded in the polymer layer 142;

S43, forming the insulating layer 16 on the first polymer surface 1422, wherein each carbon nanotubes 144 passes through entire insulating layer 16, and the first end 1442 is flush with the surface of the insulating layer 16 away from the polymer layer 142;

S44, forming the cathode electrode 18 on a surface of the insulating layer 16 away from the polymer layer 142, wherein the first end 1442 of the carbon nanotube 144 is in direct contact with the surface of the cathode electrode 18, and is not embedded into the interior of the cathode electrode 18;

S45, forming the anode electrode 12 on the support 10; and

S46, locating the second polymer surface 1424 on the surface of the anode electrode 12 away from the support 10.

The method for making the polymer solar cell 400 in the fourth embodiment is similar to the method for making the polymer solar cell 100 in the first embodiment above except that the steps S43, S44 are different from the steps S13, S14. In the step S43, when the insulating layer 16 is formed by sputtering, coating, vapor deposition, mask etching, spraying, or inkjet printing, the insulating layer 16 covers the carbon nanotube 144, but the first end 1442 of carbon nanotube 144 is exposed, and the first end 1442 is flush with the surface of the insulating layer 16 away from the polymer layer 142. Since the first end 1442 is flush with the surface of the insulating layer 16 away from the polymer layer 142, the cathode electrode 18 is formed on the insulating layer 16 away from the polymer layer 142 by sputtering, coating, vapor deposition, mask etching, spraying, or inkjet printing, the first end 1442 is in direct contact with the surface of the cathode electrode 18 and is not embedded into the interior of the cathode electrode 18.

Figure 11:
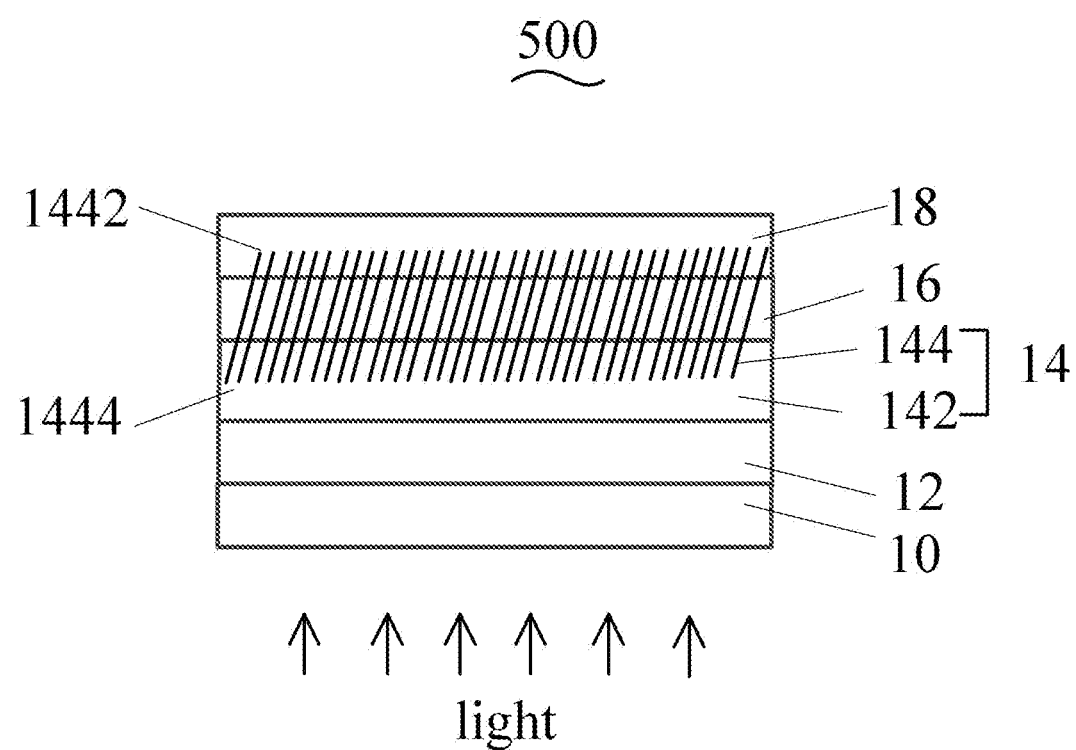
FIG. 11 schematically shows a fifth embodiment of a polymer solar cell.

FIG. 11 shows a polymer solar cell 500 of a fifth embodiment. The polymer solar cell 500 of the fifth embodiment is similar to the polymer solar cell 100 of the first embodiment above except that the arrangement of the carbon nanotubes 144. In the polymer solar cell 100 of the first embodiment, the length directions of the carbon nanotubes 144 is substantially perpendicular to the first polymer surface 1422 of the polymer layer 142. In the polymer solar cell 500 of the fifth embodiment, the length directions of the carbon nanotubes 144 and the first polymer surface 1422 form an angle that is greater than 0 degrees and less than 90 degrees. In one embodiment, the angle is greater than 30 degrees and less than 60 degrees. The advantage of the polymer solar cell 500 is: the carbon nanotubes 144 are tilted in the polymer layer 142, thus the surface of the carbon nanotubes 144 (acceptor) in contact with the polymer layer 142 (donor) is increased. It is beneficial for separating more excitons into electrons and holes. Thus, the photoelectric conversion efficiency of the polymer solar cell 500 is improved.

In the fifth embodiment, the method for making the polymer solar cell 500 is provided. The method for making the polymer solar cell 500 in the fifth embodiment is similar to the method for making the polymer solar cell 100 in the first embodiment above except that the method for making the polymer solar cell 500 further includes a step of extruding the carbon nanotube array 20 before curing the polymer solution 22. The carbon nanotube array 20 can be extruded by a pressing device, such that the carbon nanotubes 144 are tilted. The degree of inclination of the carbon nanotubes 144 can be controlled by controlling the pressure, such that the angle of greater than 0 degrees and less than 90 degrees is formed between the first polymer surface 1422 and the carbon nanotubes 144.

The polymer solar cells 100 to 500 have the following advantages: 1) the conductivity in the length direction of the carbon nanotubes 144 is good, and the conductivity in the direction perpendicular to the length direction of the carbon nanotubes 144 is poor, thus when the first ends 1442 are exposed from the polymer layer 142 and in direct contact with the cathode electrode 18, the electrical conductivity between the carbon nanotubes 144 and the cathode electrode 18 is improved; 2) the carbon nanotubes 144 of the carbon nanotube array 20 are aligned themselves, and it is no longer necessary to orient the carbon nanotubes 144 by external force, such as a magnetic field.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making a polymer solar cell, comprising:
placing a carbon nanotube array into a polymer solution, wherein the carbon nanotube array comprises a plurality of carbon nanotubes, each of the plurality of carbon nanotubes has a first end and a second end opposite to the first end, the first end of each of the plurality of carbon nanotubes is exposed from the polymer solution, and the second end of each of the plurality of carbon nanotubes is immersed in the polymer solution;
curing the polymer solution to form a polymer layer, so that a photoactive layer consisting of the polymer layer and the plurality of carbon nanotubes is formed, wherein a material of the polymer layer is polymer, the polymer layer comprises a first polymer surface and a second polymer surface opposite to the first polymer surface, the first end of each of the plurality of carbon nanotubes is exposed from the polymer layer, and the second end of each of the plurality of carbon nanotubes is embedded in the polymer layer;
forming an insulating layer on the first polymer surface, wherein the first end of each of the plurality of carbon nanotubes passes through the insulating layer and exposed from the insulating layer;
forming a cathode electrode on a surface of the insulating layer away from the polymer layer, wherein the first end of each of the carbon nanotubes is in direct contact with the cathode electrode, the plurality of carbon nanotubes are electron acceptors, electrons are generated at a contact surface of the polymer layer and the plurality of carbon nanotubes, and an electrical path is defined from the plurality of carbon nanotubes to the cathode electrode; and
forming an anode electrode on the second polymer surface.

2. The method of claim 1, wherein forming the cathode electrode on the surface of the insulating layer away from the polymer layer further comprises embedding the first end of each of the plurality of carbon nanotubes in the cathode electrode.

3. The method of claim 1, wherein forming the cathode electrode on the surface of the insulating layer away from the polymer layer further comprises flushing the first end of each of the plurality of carbon nanotubes with the surface of the insulating layer away from the polymer layer.

4. The method of claim 1, wherein length directions of the plurality of carbon nanotubes are substantially perpendicular to the first polymer surface.

5. The method of claim 1, wherein placing the carbon nanotube array into the polymer solution comprises:
growing the carbon nanotube array comprising the plurality of carbon nanotubes on a growth substrate, wherein the first end of each of the plurality of carbon nanotubes is in direct contact with the growth substrate, and the second end of each of the plurality of carbon nanotubes is away from the growth substrate;
placing the polymer solution in a container; and
making a portion of each of the plurality of carbon nanotubes immersed in the polymer solution.

6. The method of claim 1, wherein placing the carbon nanotube array into the polymer solution comprises:
growing the carbon nanotube array comprising the plurality of carbon nanotubes on a growth substrate, wherein the first end of each of the plurality of carbon nanotubes is in direct contact with the growth substrate, and the second end of each of the plurality of carbon nanotubes is away from the growth substrate;
removing the growth substrate;
placing the polymer solution in a container; and
immersing a portion of each of the plurality of carbon nanotubes in the polymer solution.

7. The method of claim 1, further comprising pressing the carbon nanotube array such that the plurality of carbon nanotubes tilt, after placing the carbon nanotube array into the polymer solution and before curing the polymer solution.

8. The method of claim 7, wherein after pressing the carbon nanotube, an angle greater than 30 degrees and less than 60 degrees is formed between the first polymer surface and the plurality of carbon nanotubes.

9. The method of claim 1, further comprising forming a reflective layer on a surface of the cathode electrode away from the insulating layer after forming the cathode electrode, or on a surface of the anode electrode.

10. The method of claim 1, further comprising forming an exciton blocking layer on the first polymer surface, after curing the polymer solution and before forming the insulating layer.

11. The method of claim 1, further comprising forming an exciton blocking layer on the second polymer surface before forming the anode electrode.

12. The method of claim 1, wherein the anode electrode is in direct contact with the second polymer surface.

13. The method of claim 1, wherein a portion of each of the plurality of carbon nanotubes is embedded in the polymer layer, and the portion is in direct contact with the polymer layer.

14. The method of claim 1, wherein a material of the insulating layer is polymethyl methacrylate (PMMA), polycarbonate (PC), polyperfluoroethylene propylene (PEP), or polyvinyl fluoride (PVF).

15. A method for making a polymer solar cell, comprising:
placing a carbon nanotube array into a polymer solution, wherein the carbon nanotube array comprises a plurality of carbon nanotubes, each of the plurality of carbon nanotube has a first end and a second end opposite to the first end, the first end of each of the plurality of carbon nanotubes is exposed from the polymer solution, and the second end of each of the plurality of carbon nanotubes is immersed in the polymer solution;
curing the polymer solution to form a polymer layer, wherein the polymer layer comprises a first polymer surface and a second polymer surface opposite to the first polymer surface, the first end of each of the plurality of carbon nanotubes is exposed from the polymer layer, and the second end of each of the plurality of carbon nanotubes is embedded in the polymer layer;
forming an insulating layer on the first polymer surface, wherein the first end of each of the plurality of carbon nanotubes passes through the insulating layer and exposed from the insulating layer;
forming a cathode electrode on a surface of the insulating layer away from the polymer layer, wherein the first end of each of the plurality of carbon nanotubes is in direct contact with the cathode electrode, electrons are generated at a contact surface of the polymer layer and the plurality of carbon nanotubes, and an electrical path is defined from the plurality of carbon nanotubes to the cathode electrode; and
forming an anode electrode on the second polymer surface, wherein the anode electrode is in direct contact with the second polymer surface.

16. The method of claim 15, wherein a material of the insulating layer is polymethyl methacrylate (PMMA), poly carbonate (PC), polyperfluoroethylene propylene (PEP), or polyvinyl fluoride (PVF).

17. The method of claim 15, wherein a material of the insulating layer is polymethyl methacrylate (PMMA).

18. The method of claim 15, further comprising pressing the carbon nanotube array such that the plurality of carbon nanotubes tilt, after placing the carbon nanotube array into the polymer solution and before curing the polymer solution, so that an angle greater than 30 degrees and less than 60 degrees is formed between the first polymer surface and the plurality of carbon nanotubes.

19. The method of claim 15, wherein the curing the polymer solution to form the polymer layer further comprises curing the polymer solution, so that a photoactive layer is formed, wherein a material of the polymer layer is polymer, and the photoactive layer consists of the polymer and the plurality of carbon nanotubes.

* * * * *